United States Patent [19]

Gaultier

[11] Patent Number: 5,377,149

[45] Date of Patent: Dec. 27, 1994

[54] OUTPUT PRECHARGE CIRCUIT FOR MEMORY

[75] Inventor: Jean-Marie Gaultier, Rousset, France

[73] Assignee: SGS-Thomson Microelectronics S.A., Gentilly, France

[21] Appl. No.: 96,666

[22] Filed: Jul. 23, 1993

[30] Foreign Application Priority Data

Jul. 24, 1992 [FR] France ................................. 92 09197

[51] Int. Cl.$^5$ ..................... G11C 7/00; H03K 19/0175
[52] U.S. Cl. .............................. 365/203; 365/189.05; 365/189.08; 326/112; 327/51
[58] Field of Search .................. 365/189.5, 203, 189.8, 365/189.05, 189.08; 307/443, 451, 473

[56] References Cited

U.S. PATENT DOCUMENTS

| | | | |
|---|---|---|---|
| 4,881,203 | 11/1989 | Watanabe | 365/189.5 X |
| 4,893,276 | 1/1990 | Okuyama | 365/189.8 |
| 4,988,888 | 1/1991 | Hirose | 307/443 |
| 5,058,066 | 10/1991 | Yu | 365/189.5 |
| 5,151,621 | 9/1992 | Goto | 307/475 |
| 5,204,838 | 4/1993 | Son | 365/203 |

FOREIGN PATENT DOCUMENTS

| | | | |
|---|---|---|---|
| 0319223 | 6/1989 | European Pat. Off. | 365/189.5 |
| 0471289 | 2/1992 | European Pat. Off. | 365/189.5 |

OTHER PUBLICATIONS

IEEE Journal of Solid-State Circuits, vol. 23, No. 5, Oct. 1988, New York, US, pp. 1060-1066, Kohno et al., "A 14-NS 1-Mbit CMOS SRAM with Variable Bit Organisation".

Primary Examiner—Eugene R. LaRoche
Assistant Examiner—Son Mai
Attorney, Agent, or Firm—Wolf, Greenfield & Sacks

[57] ABSTRACT

The invention relates to memories made in integrated circuit form and, particularly, to high capacity memories that need to have fast access time. The invention provides for carrying out a reading in two stages: precharging and then reading. A precharging is done, at an intermediate value, between the high logic level and the low logic level, of the data output pads at which the information elements read in the memory appear. A circuit to memorize the logic state on the pad and a threshold inverter enable this result to be obtained.

21 Claims, 1 Drawing Sheet 5,377,149

OUTPUT PRECHARGE CIRCUIT FOR MEMORY

BACKGROUND OF THE INVENTION

1. Field of the Invention

The invention relates to memories made in integrated circuit form. The invention relates more particularly, but not exclusively, to non-volatile electrically erasable and programmable memories (EEPROMs and flash EPROMS).

2. Description of the Prior Art

One of the important factors in the use of integrated circuit memories is the speed of access to the information contained in the memory cells. Now, a great many factors tend to limit this speed, especially in memories having high storage capacity (of one megabit or more).

There is a known way of using a bit line precharging operation before the reading phase. The bit line to which a column of memory cells is connected is precharged at an intermediate voltage between a high logic level and a low logic level, before the reading phase itself. The reading amplifier that is connected between this bit line and a reference line will switch over in one direction or the other depending on the state of the cell to be read.

An aim of the invention is to improve the speed of transmission of the information at the output of the memories.

According to the invention, it is proposed to precharge, at an intermediate value between a high logic level and a low logic level, the output pad or pads of the integrated circuit chip, on which the logic information elements contained in the memory appear.

It has indeed been observed that one factor in the slowing down of the access to the information could be a result of what happens outside the memory (for example the existence of a high capacitive charge connected externally to the memory), and that this slowing down process can be partially compensated for by steps taken within the memory chip.

SUMMARY OF THE INVENTION

According to the invention, there is provided a memory including an output amplifier connected between a reading differential amplifier and an external data input/output pad of the memory, and means for precharging the output of the amplifier at an intermediate value of potential between two potential levels corresponding respectively to a high logic level and a low logic level. The precharging takes place before a stage for the transmission of information to the output of the amplifier.

Preferably, the precharging means includes means, which are active during a precharging stage, for the discharging, towards a low potential supply terminal, of the output pad if it has remained at a high potential during the previous reading, and for the charging of the pad from a high potential supply terminal if the pad has remained at a low potential after a previous reading.

Provision is made for at least one threshold detector having an input connected to the pad to monitor the potential of the pad and limit the charging or discharging of the pad to the intermediate potential value during the precharging stage.

According to an embodiment of the invention, the output amplifier has a charging transistor and a discharging transistor both connected to the output pad, a first logic gate to control the charging transistor and a second logic gate to control the discharging transistor.

The first logic gate enables the charging transistor to be made conductive, firstly during the reading phase for a first logic state of a data element to be read and, secondly, during the precharging stage, so long as the pad is not charged to the intermediate value. The second logic gate, reciprocally, enables the discharging transistor to be made conductive, firstly during the reading phase for a second logic state of a signal to be read and, secondly, during the precharging phase so long as the pad has not been discharged to the intermediate voltage. Separate threshold detectors may be designed to control the first gate and the second gate respectively.

In a particular embodiment of the invention, there is provision for a circuit to memorize the logic state of the pad during the previous reading and for a connection between the output of this memorizing circuit and the logic gates, this connection being activated during the precharging phase, to inhibit the conduction of either of the transistors depending on the logic state of the pad during the previous reading.

There is additionally provision for hold circuits between the output of the differential amplifier and the inputs of the logic gates for the holding, at the input of these logic gates, of the state of the previously read signal between he end of a reading phase and the start of a subsequent precharging phase.

BRIEF DESCRIPTION OF THE DRAWINGS

Other features and advantages of the invention shall appear from the following detailed description, made with reference to the appended drawings, of which.

DETAILED DESCRIPTION

Figure 1:
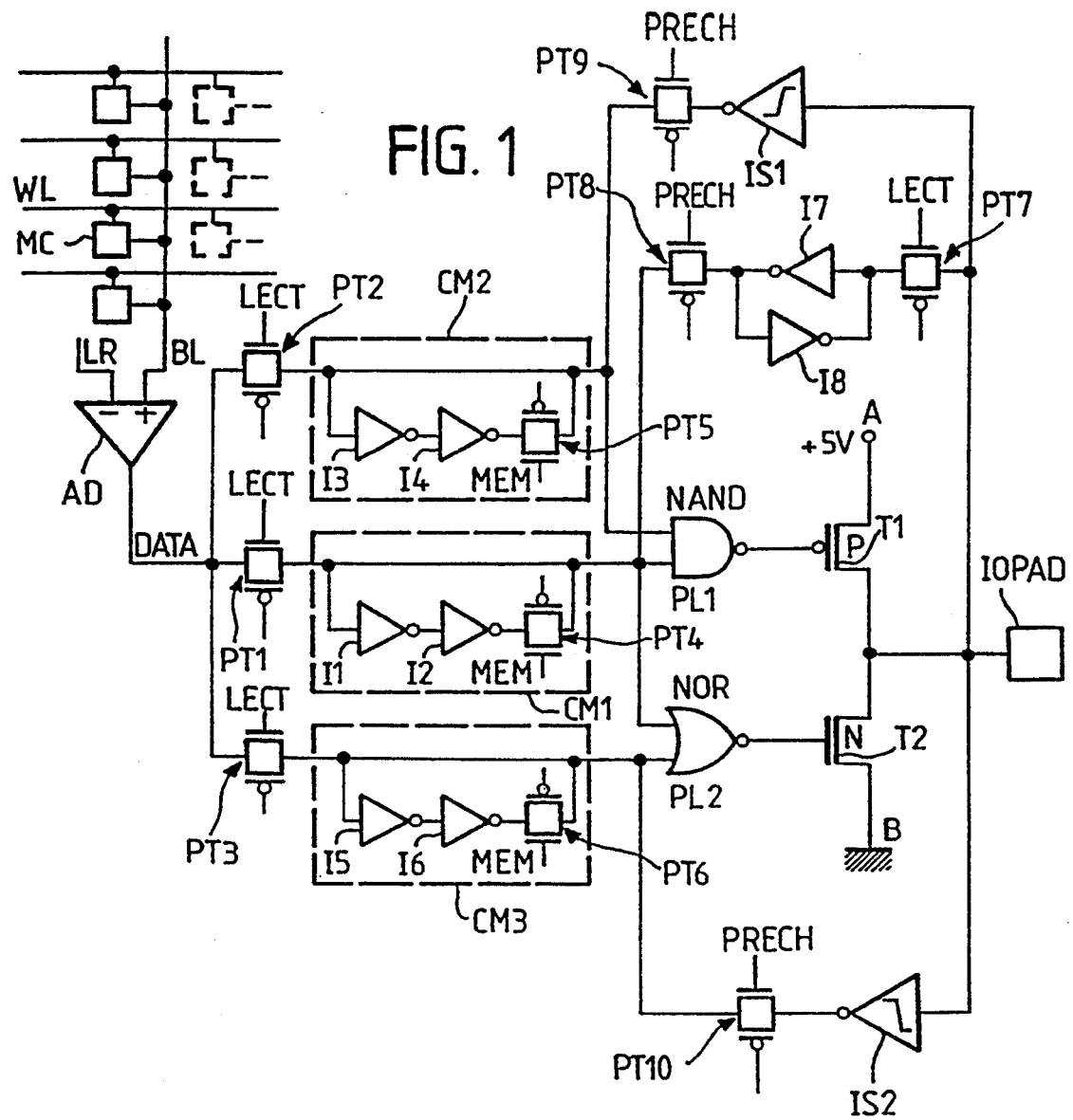
FIG. 1 is a partial schematic, partial block diagram showing a preferred embodiment of the invention.

The memory includes an array of memory cells. The memory cells MC of a same column are connected to a common conductor, referred to as a bit line BL, this conductor is used to transmit an information element on the state of a cell of the column, the cell being designated by a word line WL.

The information is read by a differential amplifier AD which, during a reading phase, is connected at one input to the bit line BL which has been precharged beforehand by means (not shown) and, at another input, is connected to a reference line LR and receives the voltage potential present on the reference line LR.

The information on the state of the cell is constituted by a signal referenced DATA at output of the differential amplifier AD. This signal DATA is a logic signal that is high or low depending on the information element read in the cell designated at the time of the reading.

This logic signal DATA must be transmitted to an external pad of the memory, designated by the reference IOPAD; an output amplifier or buffer amplifier is used to transmit the logic value of the signal DATA to an output of the memory which may be the pad IOPAD, with an output impedance that is low enough to supply the circuits connected to the exterior of the memory chip.

According to the invention, the output amplifier works in two phases: first, a precharging phase and then a phase for the transmission of the logic level of the signal DATA. The buffer amplifier has two output transistors used o provide the desired logic level on the pad IOPAD. These transistors are respectively a charging transistor T1 and a discharging transistor T2. In CMOS technology, a P channel charging transistor, having its source connected to a positive supply terminal A, and an N channel discharging transistor, having its source connected to a low supply terminal B, will be used. The transistor T1 should be on and transistor T2 should be off when the signal DATA corresponds to the placing of the pad IOPAD at the high logic level; conversely, the resistors T1 should be off and the transistor T2 on when the signal DATA corresponds to the setting of the pad IOPAD at the low logic level.

It will be seen that, if a first reading of information leads to placing the pad IOPAD at a high potential, then the second reading will give a fast information element if it must also lead to a high level but will give a slower information element if it must lead to a low level because, in the latter case, it is necessary o take the time needed to discharge the pad and the external lines connected to this pad. Conversely, if the above reading operation places the pad at a low level, then the obtaining of an information element will be delayed if the new information element corresponds to a high logic level.

To balance the speed with which the information is supplied in the two possible cases (the successive supply of two identical levels or the supply of two different levels), the output pad is precharged at an intermediate value between the two logic levels, during a precharging phase that immediately precedes the reading proper. The logic levels considered herein are the standard levels accepted in the technology used. For example, in CMOS technology, these levels may be equal to 0.8 volts for the low level and 2 volts for the high level. The intermediate value could be about 1.4 volts.

Figure 2:
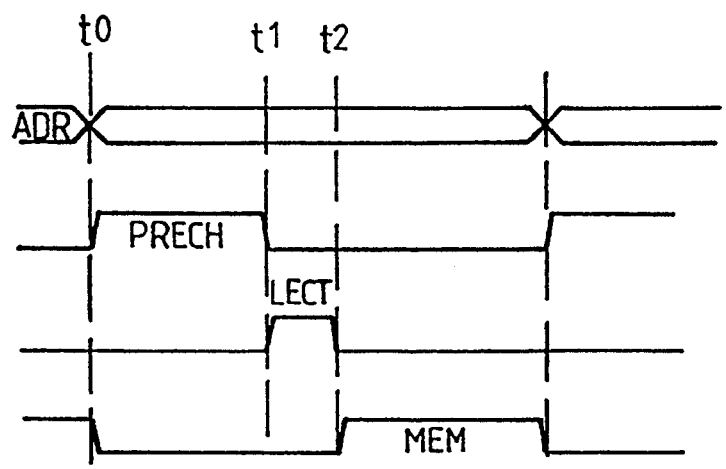
FIG. 2 is a timing diagram representing the stages of operation of the circuit of FIG. 1.

The sequencing of the operations, starting from an instant t0 defined by the detection of a change in address (ADR) of information to be read, will include a precharging phase PRECH (t0 to t1, with a duration of about 30 nanoseconds for example) and then a reading phase LECT (t1 to t2 lasting about 10 nanoseconds), and then a phase of waiting for a new change in address of information to be read, as shown in FIG. 2. It should be noted that this additional precharging phase does not entail any loss of time since it can be done at the same time as the bit line BL precharging phase, before the preparation of the signal DATA.

A first logic gate PL1 controls the gate of the transistor T1 and a second logic gate PL2 controls the gate of the transistor T2. In the example shown in FIG. 1, the logic gate PL1 is a two-input NAND gate and the logic gate PL2 is a two-input NOR gate.

During the reading phase, the first input of the NAND gate PL1 receives the signal DATA representing the information to be transmitted to the output pad. The first input of the NOR gate receives the same signal. The output of the amplifier AD is connected to these first inputs by means of a transfer gate PT1 that is turned on only during the reading phase, after the precharging phase. The signal LECT which controls certain transfer gates shown in FIG. 1 defines this reading phase (see FIG. 2). The transfer gates are constituted by an N channel MOS transistor controlled by a logic signal, connected in parallel with a P channel MOS transistor controlled by a complementary logic signal.

The second input of the NAND gate PL1 also receives the signal DATA through another transfer gate PT2, which is on during the reading phase LECT. In the same way, the first input of the NOR gate PL2 receives the signal DATA through the gate PT1 and the second input receives the signal DATA through a transfer gate PT3 that is turned on by the signal LECT.

For reasons related to the need to release the differential amplifier AD very speedily for a new reading even before the information element has been completely stabilized at the pad IOPAD, there is provision for auxiliary hold circuits to memorize and hold the value of the signal DATA at the inputs of the logic gates PL1 and PL2 even after the signal DATA has disappeared. There is a hold circuit after each transfer gate PT1, PT2, PT3. Each hold circuit, CM1, CM2, CM3 respectively, includes a servo-controlled loop with two cascade-connected inverters, in series with a transfer gate. The input of the second inverter is connected to the output of the first inverter, the output of the second inverter is connected to the input of the transfer gate and the output of this transfer gate is "looped" to the input of the first inverter. The transfer gate of the hold circuit is controlled by a signal MEM which provides for the safeguarding of the information element (DATA) as soon as the signal DATA corresponding to a new reading operation has taken a new value. The signal MEM appears as soon as the reading phase (LECT) has ended and is held to the next precharging phase, i.e. throughout the waiting time before the detection of a change in address of information to be read. The first hold circuit CM1, corresponding to a double inverter I1, I2 and a transfer gate PT4, is connected to the output of the gate PT1, i.e. the input of the inverter I1 and the output of the gate PT4 are connected to this output of the gate PT1.

In the way described above, the second hold circuit CM2 (inverters I3, I4, and transfer gate PT5 controlled by the signal MEM) is connected to the output of the transfer gate PT2. The third hold circuit CM3 (inverters I5, I6, and transfer gate PT6 controlled by the signal MEM) is connected to the transfer gate PT3. When the signal LECT is sent to apply the signal DATA to the gates PL1 and PL2, the signal MEM is in the low state (gates PT4, PT5, PT6 are off).

The reading signal LECT makes the gates PT1, PT2, PT3 conductive; the signal DATA appears at the inputs of the gates PL1 and PL2 and then becomes stabilized; the signal LECT can then be returned to the low state and the signal MEM is applied to the gates PT4, PT5, PT6 to turn them on and activate the hold circuits to memorize the signal DATA. The logic value of the signal DATA then remains applied to the inputs of the logic gates PL1 and PL2 even if the output of the amplifier AD stops giving the signal DATA.

If the signal DATA is at a high logic level (1), the output of the NAND gate goes to zero since its two inputs are at 1. The charging transistor T1 is then made conductive, charging the pad IOPAD at the high level from the high supply terminal A. The transistor T2 remains off, and the output of the NOR gate is at 0 because its two inputs are at 1.

If, on the contrary, the signal DATA is at a low logic level (0), the output of the NOR gate goes to 1 and makes the discharging transistor T2 conductive to force the output pad to level 0. The NAND gate provides the level 1 which turns the transistor T1 off.

For the precharging, the following specific supplementary elements are provided for: a circuit to inhibit one of the gates PL1 and PL2 as a function of the preceding logic state of the pad IOPAD, and a threshold detector to limit the precharging of the pad IOPAD to a determined value.

According to a preferred embodiment of the invention, there is provided a circuit which memorizes the previous logic value of the pad IOPAD. This circuit includes, for example, an inverter I7 connected in parallel with another inverter I8 that is more resistive than the first one. The input of this memorizing circuit (input of the inverter I7) is connected to the pad by means of a transfer gate PT7 that is turned on during the reading phase LECT; the memorizing circuit therefore memorizes the state of the pad during the reading phase. The output of the memorizing circuit (output of the inverter I7) is connected to the first input of the NAND gate PL1 and the first input of the NOR gate PL2, by means of a transfer gate PT8 that is turned on during the precharging phase PRECH. The logic state present at the pad, inverted by the inverter I7 and memorized by this inverter, is therefore transmitted to the input of the NAND and NOR gates throughout the precharging phase.

The output of the memorizing circuit is used simply to inhibit the working of either one of the gates PL1 and PL2 to prohibit the conduction of the charging transistor or of the discharging transistor depending on the logic state of the pad at the previous reading: if the memorized logic state is 1, a 0 state is transmitted to the input of the NAND gate during the next precharging state. This prevents the conduction of the transistor T1 irrespective of the state of the other input. The NOR gate is not affected and may make the transistor T2 conductive according to the state of the other input of this gate. Conversely, if the state of the pad at the previous reading is 0, a state 1 is transmitted by the memorizing circuit during the next precharging phase to prohibit the conduction of the transistor T2; the conduction of the transistor T1 will not be inhibited and will depend on the state of the other input of the NAND gate.

The second input of the NAND gate PL1 receives the output of a transfer gate PT9 which itself receives the output of a threshold inverter IS1, the input of this inverter IS1 being connected to the pad IOPAD. The second input of the NAND gate furthermore receives the signal DATA through the output of the hold circuit CM2. However, during the precharging phase PRECH, the signal LECT and the signal MEM are at zero, blocking the gates PT2 and PT5, so that the signal DATA is no longer transmitted actively to the inputs of the NAND and NOR gates.

In the same way, the second input of the NOR gate PL2, which no longer receives the signal DATA of the previous reading during the precharging phase PRECH, receives the output of a threshold inverter IS2 by means of a transfer gate PT10 activated by the signal PRECH. The threshold inverters are used to authorize the placing, in a state of conduction, of the transistors T1 or T2, the conduction of which is not prohibited by the inhibition circuit during the precharging. This conduction is authorized so long as the potential of the pad has not reached the desired intermediate precharging value; it is then stopped. The threshold of the inverters IS1 and IS2 is set at a value that is directly related to the value of the precharging potential to be applied to the pad IOPAD during the precharging phase.

The circuit works as follows: if the signal DATA of the previous reading is at 1, the pad is charged to about 5 volts at the end of the reading step. During the precharging phase which prepares the next reading operation, the NAND gate is inhibited by the output of the gate PT8. The NOR gate receives a logic state 0 at its first input through the gate PT8 and a logic state 0 by the threshold inverter since the pad is at 1. The NOR gate provides a high level at its output; the discharging transistor T2 becomes conductive and discharges the high potential of the pad IOPAD. The potential of this pad falls. But as soon as it reaches the desired precharging value, defined by the threshold of the inverter IS2, the inverter IS2 flips over, causes the flip-over of the NOR gate and turns the transistor T2 off, so that the discharging of the pad stops. The pad remains charged at the desired precharging value which is at an intermediate level between a high logic level and a low logic level. The situation then remains in this state until the end of the precharging phase PRECH and until the appearance of the signal LECT which defines the new reading phase.

Conversely, if the signal DATA of the previous reading is at 0, the plot is initially discharged to 0 volts at the end of the reading step. During the precharging phase which prepares the next reading operation, the NOR gate is inhibited by the output of the gate PT8. The NAND gate receives a logic state 1 on its first input through the gate PT8 and a logic state 1 by the threshold inverter IS1 since the pad is at 0. The NAND gate therefore provides a low level at its output; the charging transistor T1 becomes conductive and charges the pad IOPAD. The potential of this pad rises; as soon as it reaches the desired precharge value, defined by the threshold of the inverter IS1, the inverter IS1 flips over, causes the NAND gate to flip over and turns the transistor T1 off, so that the charging of the pad stops. The pad remains charged at the desired precharging value which is an intermediate value between a high logic level and a low logic level.

Since it is difficult to make a threshold inverter that works without hysteresis, i.e., one that flips over for the same input voltage value, both in the direction of the increasing voltages and in the direction of the decreasing voltages, it is preferred to use two separate inverters IS1 and IS2, but it will be understood that if hysteresis is acceptable, the two inverters could be replaced by a single inverter since they are parallel connected.

The level of the intermediate potential at which the pad is precharged is preferably between 1 and 2 volts for a 5-volt voltage supply, and an appropriate value is about 1.4 volts. Although the supply is a 5-volt supply, the low logic level is considered to be at a value of less than about 0.8 volts, and the high logic level is considered to have reached the region of 2.2 volts. This explains the values indicated as ranges of intermediate values preferred for the precharging of the output of the amplifier.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A memory integrated circuit comprising:
   a network of memory cells to store information elements;

a bit line, coupled to the network, to communicate the information elements;

an output pad, coupled to the bit line, receiving and outputting the information elements;

an output amplifier, coupled to the bit line and the output pad, selectively providing the information elements from the bit line to the output pad; and means, coupled to the output amplifier, for precharging the output amplifier during a precharging phase to a predetermined voltage before a reading phase during which an information element is provided to the output pad, wherein the predetermined voltage is substantially equal to an intermediate voltage between a high logic level and a low logic level of the output pad, wherein said means for precharging includes means for selectively forcing one of a charging transistor and a discharging transistor, both connected to said output pad, to a conductive state, in response to the state of the information element prior to said precharging phase.

2. An integrated circuit as claimed in claim 1 wherein the high logic level is substantially equal to 5 volts and the intermediate voltage is substantially within the range of 1 to 2 volts.

3. An integrated circuit as claimed in claim 2 wherein the intermediate voltage is substantially equal to 1.4 volts.

4. An integrated circuit as claimed in claim 1 wherein the output amplifier includes said charging transistor and said discharging transistor connected in series, both transistors being coupled to the output pad.

5. An integrated circuit as claimed in claim 4 further comprising means, coupled to the charging transistor and the discharging transistor, for controlling conduction of the transistors, the means for controlling including means for forcing the charging transistor into a conductive state and for forcing the discharging transistor into an off state when an information element provided by the bit line corresponds substantially to the high logic level, and means for forcing the discharging transistor to a conductive state and forcing the charging transistor to an off state when an information element provided by the bit line corresponds substantially to the low logic level.

6. A memory integrated circuit comprising:

a network of memory cells to store information elements;

a bit line, coupled to the network, to communicate the information elements;

an output pad, coupled to the bit line, receiving and outputting the information elements;

an output amplifier, coupled to the bit line and the output pad, selectively providing the information elements from the bit line to the output pad, wherein said output amplifier includes:

a charging transistor and a discharging transistor connected in series, both transistors being coupled to the output pad, and means, coupled to the transistors, for controlling conduction of the transistors, such that the charging transistor is forced into a conductive state and the discharging transistor is forced into an off state when an information element provided by the bit line corresponds substantially to a high logic level, and the discharging transistor is forced into a conductive state and the charging transistors is forced into an off state when an information element provided by the bit line corresponds substantially to a low logic level;

means, coupled to the output amplifier, for precharging the output amplifier during a precharging phase to a predetermined voltage before a reading phase during which an information element is provided to the output pad, wherein the predetermined voltage is substantially equal to an intermediate voltage between a high logic level and a low logic level of the output pad; and a memorizing circuit, coupled to the output pad and to the means for controlling conduction, storing, during the precharging phase, a logic level present at the output pad during a previous reading phase, and prohibiting conduction of one of the charging or discharging transistors.

7. An integrated circuit as claimed in claim 6 wherein:

the means for forcing the charging transistor to a conductive state includes a first logic gate coupled to the charging transistor;

the means for forcing the discharging transistor to a conductive state includes a second logic gate coupled to the discharging transistor; and the memorizing circuit is coupled to the first and second logic gates.

8. An integrated circuit as claimed in claim 7 further comprising a threshold inverter having an input and an output, the input of the threshold inverter coupled to the output pad and the output of the threshold inverter coupled to the first and second logic gates.

9. An integrated circuit as claimed in claim 7 wherein the first logic gate includes a NAND gate and the second logic gate includes a NOR gate, both gates receive, during the reading phase, a logic signal representing an information element provided by the bit line.

10. An integrated circuit as claimed in claim 9 wherein the NAND gate and the NOR gate each have a first input and a second input, the first input of each gate receiving, during the precharging phase, an output of the memorizing circuit and the second input of each gate receiving, during the precharging phase, the output of the threshold inverter.

11. An integrated circuit as claimed in claim 7 further comprising a first threshold inverter coupled between the output pad and the first logic gate and a second threshold inverter coupled between the output pad and the second logic gate.

12. An integrated circuit as claimed in claim 7 further comprising at least one hold circuit coupled between the bit line and the first and second logic gates, to maintain information elements read from the memory cells at the logic gates.

13. A memory integrated circuit comprising:

a network of memory cells to store information elements;

a bit line, coupled to the network, to communicate the information elements;

an output pad, coupled to the bit line, receiving and outputting the information elements;

an output amplifier, coupled to the bit line and the output pad, selectively providing the information elements from the bit line to the output pad; and a precharging circuit, coupled to the output amplifier, precharging the output amplifier during a precharging phase to a predetermined voltage before a reading phase, wherein the predetermined voltage is substantially equal to an intermediate voltage between a high logic level and a low logic level of the output pad, by selectively forcing one of a charging transistor and a discharging transistor, both connected to said output pad, to a conductive state, in response to the state of the information element prior to said precharging phase.

14. An integrated circuit as claimed in claim 13 wherein the high logic level is substantially equal to 5 volts and the intermediate voltage is substantially within the range of 1 to 2 volts.

15. An integrated circuit as claimed in claim 14 wherein the intermediate voltage is substantially equal to 1.4 volts.

16. An integrated circuit as claimed in claim 15 wherein the output amplifier includes said charging transistor and said discharging transistor connected in series, both transistors being coupled to the output pad.

17. An integrated circuit as claimed in claim 16 wherein the output amplifier further includes at least one logic gate to force the charging transistor to a conductive state and the discharging transistor to an off state when an information element provided by the bit line corresponds to the high logic level and to force the discharging transistor to a conductive state and the charging transistor to an off state when an information element provided by the bit line corresponds to the low logic level.

18. A memory integrated circuit comprising:
a network of memory cells to store information elements;
a bit line, coupled to the network, to communicate the information elements;
an output pad, coupled to the bit line, receiving and outputting the information elements;
an output amplifier, coupled to the bit line and the output pad, selectively providing the information elements from the bit line to the output pad, wherein said output amplifier includes:
a charging transistor and a discharging transistor connected in series, both transistors being coupled to the output pad, and
at least one logic gate to force the charging transistor to a conductive state and the discharging transistor to an off state when an information element provided by the bit line corresponds to a high logic level and to force the discharging transistor to a conductive state when an information element provided by the bit line corresponds to a low logic level;
a precharging circuit, coupled to the output amplifier, precharging the output amplifier during a precharging phase to a predetermined voltage before a reading phase, wherein the predetermined voltage is substantially equal to an intermediate voltage between a high logic level and a low logic level of the output pad; and
a memorizing circuit, coupled to the output pad, to store, during the precharging phase, a logic level present at the output pad during a previous reading phase.

19. An integrated circuit as claimed in claim 18 further comprising a threshold inverter having an input and an output, wherein the input of the threshold inverter is coupled to the output pad and the output of the threshold inverter is coupled to the logic gates to control operation of the transistors.

20. A method for outputting information stored in a memory integrated circuit comprising the steps of:
storing information elements;
selectively providing the stored information elements to an output pad during a reading phase; and
during a precharging phase before the reading phase, selectively forcing one of a charging transistor and a discharging transistor, both connected to said output pad to a conductive state in response to the state of the information element prior to said precharging phase, for precharging the output pad to a predetermined voltage substantially equal to an intermediate voltage between a high logic level and a low logic level of the output pad.

21. A method as claimed in claim 20 wherein the step of storing includes the step of storing information elements in a network of memory cells and the step of selectively providing includes the step of communicating information elements along a bit line.

* * * * *